(12) United States Patent
Cress (10) Patent No.: US 9,620,930 B2
(45) Date of Patent: Apr. 11, 2017

(54) REFLECTION BASED SIGNAL PRE-EMPHASIS

(71) Applicant: ADTRAN, INC., Huntsville, AL (US)

(72) Inventor: Jared Cress, Huntsville, AL (US)

(73) Assignee: ADTRAN, INC., Huntsville, AL (US)

( * ) Notice: Subject to any disclaimer, the term of this patent is extended or adjusted under 35 U.S.C. 154(b) by 0 days.

(21) Appl. No.: 14/812,086

(22) Filed: Jul. 29, 2015

(65) Prior Publication Data

US 2017/0033530 A1 Feb. 2, 2017

(51) Int. Cl.
*H01S 3/00* (2006.01)
*H01S 5/042* (2006.01)
*H01S 5/026* (2006.01)

(52) U.S. Cl.
CPC ............ *H01S 5/042* (2013.01); *H01S 5/0261* (2013.01); *H01S 2301/04* (2013.01)

(58) Field of Classification Search
CPC ..... H01S 5/042; H01S 5/0261; H01S 2301/04
See application file for complete search history.

(56) References Cited

U.S. PATENT DOCUMENTS

| | | | | |
|---|---|---|---|---|
| 3,459,942 A | * | 8/1969 | Anderson | H01S 5/042 372/38.1 |
| 4,849,981 A | * | 7/1989 | Toda | H04B 3/04 333/24 R |
| 5,521,933 A | * | 5/1996 | Sosa | H01S 5/042 333/32 |
| 5,987,045 A | * | 11/1999 | Albares | H01S 5/042 372/38.02 |
| 7,054,344 B1 | * | 5/2006 | Nguyen | H01S 5/042 372/38.02 |
| 7,885,300 B1 | * | 2/2011 | Sidiropoulos | H01S 5/042 372/38.02 |
| 7,970,811 B2 | | 6/2011 | Shen | |
| 8,198,912 B1 | * | 6/2012 | Thinakaran | H03K 19/01707 326/30 |
| 2004/0208207 A1 | * | 10/2004 | Kasper | H04B 10/504 372/26 |

OTHER PUBLICATIONS

International Search Report and Written Opinion of the International Searching Authority issued in international Application No. PCT/US2016/044218 on Nov. 28, 2016; 12 pages.

(Continued)

*Primary Examiner* — Yuanda Zhang
(74) *Attorney, Agent, or Firm* — Fish & Richardson P.C.

(57) ABSTRACT

Systems, and apparatus for adding reflection based pre-emphasis to a laser driver. In one aspect, a device includes a load (e.g. a laser) having a load impedance, a first end of a transmission line connected to the load, and a reflective impedance element connected to a second end of the transmission line. The reflective impedance element has a given impedance value that differs from the transmission line's characteristic impedance, and the characteristic impedance differs from the load impedance. This mismatch causes reflections between the reflective impedance element and the load. The reflections between the reflective impedance element and the load combine with an incident signal at the load to create a target signal having a target spectral shape.

20 Claims, 8 Drawing Sheets (56) References Cited

OTHER PUBLICATIONS

Guo, Wei-Da et al.; "Reflection Enhanced Compensation of Loss Traces for Best Eye-Diagram Improvement Using High-Impedance Mismatch"; IEEE Transactions on Advanced Packaging; vol. 31, No. 3; Aug. 1, 2008; pp, 619-626.
Sredojevic; R. et al.; "Digital Link Pre-Emphasis with Dynamic Driver Impedance Modulation"; Custom Integrated Circuits Conference; Sep. 19, 2010; pp. 1-4.
Kim, Jintae et al.; "A Large-Swing Transformer-Boosted Serial Link Transmitter with Swing"; IEEE Journal of Solid-State Circuits; vol. 3, No. 5; May 1, 2007; pp. 1131-1142.

\* cited by examiner

REFLECTION BASED SIGNAL PRE-EMPHASIS

BACKGROUND

Internet usage and network traffic have evolved over time. Fiber optic networks have been deployed to carry data over optical communications channels. Parasitic elements in the components of an optical communications channel can degrade the optical signals that carry the data over the optical communications channel, which can negatively affect communications.

SUMMARY

This specification relates to modulation of laser devices. In general, one innovative aspect of the subject matter described in this specification can be embodied in devices that include a load having a load impedance; a first end of a transmission line connected to the load; and a reflective impedance element connected to a second end of the transmission line. The transmission line has a characteristic impedance that differs from the load impedance and the reflective impedance element has a given impedance value that differs from the characteristic impedance. Mismatches between the characteristic impedance and each of the given impedance value and the load impedance value causes reflections between the reflective impedance element and the load. The reflections between the reflective impedance element and the load combine with an incident signal at the load to create a signal having a target spectral shape. Other embodiments of this aspect include corresponding methods, systems and apparatus.

These and other embodiments can each optionally include one or more of the following features. The transmission line can be selected to provide a target amount of propagation delay. The specified amount of propagation delay can be selected to achieve the signals having the target spectral shape. The transmission line can provide a propagation delay corresponding to ½ a baud time in each direction.

The target spectral shape can flatten a frequency response of at least some portion of the system. The target spectral shape can be selected to offset parasitics that create bandwidth limitations in the system. The target spectral shape can offset undesired filtering effects resulting from said parasitic elements.

The reflective impedance element can be a discrete resistor, inductor, or capacitor connected to the source by a first transmission line and connected to the load by a second transmission line. The load can be a laser. The load parasitics can create a low pass filter response. The reflective impedance element can include a second transmission line having a second transmission line impedance that differs from the characteristic impedance.

Another innovative aspect of the subject matter described in this specification can be embodied in methods that include the actions of creating an initial reflected signal based on a load incident signal and an impedance mismatch between a load impedance of a load and a characteristic impedance of a transmission line connected to the load; creating a second reflected signal based on the initial reflected signal and an impedance mismatch between a reflective impedance element and the characteristic impedance; and creating a target load signal having a target shape based on a combination of the second reflected signal and the load incident signal. Other embodiments of this aspect include corresponding systems and apparatus.

These and other embodiments can each optionally include one or more of the following features. Creating a second reflected signal can include creating a second reflected signal that has an opposite polarity relative to the load incident signal.

Methods can include the actions of delaying arrival of the second reflected signal at the load for ½ a baud time from creation of the second reflected signal.

Creating a target load signal having a target shape can include creating a target load signal having a spectral shape of a high pass filter. Creating a target load signal having a target spectral shape can include creating target load signal having a target spectral shape that flattens a frequency response of at least a portion of a communications system. Creating a target load signal having a target spectral shape can include creating target load signal having a target spectral shape that offsets undesired effects of parasitic elements of a device.

Another innovative aspect of the subject matter described in this specification can be embodied in systems that include a transmission channel; and a communications node that communicates over the transmission channel. The communications node can include a load that outputs a communications signal over the transmission channel. The load has a load impedance. The communications node also has a reflective impedance element connected to the load through a transmission line. An impedance mismatch between the reflective impedance element and the transmission line create reflections that combine with a portion of a load incident signal to create a target load signal having a target spectral shape that differs from the load incident signal. Other embodiments of this aspect include corresponding systems and apparatus.

These and other embodiments can each optionally include one or more of the following features. A length of the transmission line can be selected to provide a target amount of propagation delay. A length of the transmission line can provide a propagation delay of ½ a baud time of the load incident signal.

The target spectral shape can flatten a frequency response of a portion of the system.

The reflective impedance element can be one of a discrete circuit component connected between a source and the transmission line, a different transmission line that connects the source to the transmission line, a combination of the source and a resistor connected between the source and the transmission line, a combination of the source and the different transmission line that connects the source to the transmission line, or a source having a source impedance that differs from the characteristic impedance of the transmission line.

Particular embodiments of the subject matter described in this specification can be implemented so as to realize one or more of the following advantages. A bandwidth limited devices can sometimes be operated at higher data rates by adding pre-emphasis to the signal being transmitted. Pre-emphasis techniques disclosed in this document have the advantage that pre-emphasis can be added even to laser drivers that do not support this function via other means. This is accomplished by interposing a mismatched transmission line between the laser driver and the laser diode, using the resultant reflections to create the desired shaping. Also, no modification to the fiber plant is required to achieve higher bandwidth systems using lower bandwidth devices. The systems, devices, and methods described below can be implemented in both passive optical networks (PONs) and active optical networks (AONs). The subject matter described in this document can be used to achieve higher laser performance without incurring higher costs that may be incurred to use a laser that would provide similar performance without the use of the subject matter described in this document. The techniques discussed in this document can also be used in electrical transmission environments.

The details of one or more embodiments of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

The subject matter below relates to systems and methods where reflection based pre-emphasis is used to enhance optical transmission of an optical signal across a channel. As described in more detail throughout this document, electrical reflections that occur due to mismatched transmission lines can be used to create a pre-emphasized signal that has a desired shape. For example, assume that a laser has a rated bandwidth of one Gigabit per second (1.0 Gbps), with the laser itself acting as a low pass filter. Further assume that a transmission line is used to connect a source to the laser. In this example, a transmission line characteristic impedance and a source impedance can be selected to create a pre-emphasized signal that will flatten the spectral shape of the laser output beyond the rated bandwidth of the laser. For example, the reflections caused by the impedance mismatches can result in a pre-emphasized signal that compensates for the high-frequency losses imposed by the low-pass nature of the laser. As such, the resulting spectral shape of the laser output will be flat beyond the rated bandwidth of the laser, thereby enabling higher speed communications.

The description that follows provides examples of how mismatched transmission line(s) can be used to create signals that have a desired or target spectral shape. Pre-emphasis circuits are often built with finite impulse response (FIR) filters. For clarity in conveying the concepts, the example implementations discussed in this document are modeled after FIRs providing 1 postcursor tap. However, those skilled in the art will recognize that the concept can be extended to the equivalent of two or more postcursor taps by cascading multiple levels of delay and reflection. Furthermore, the following description is not limited to the FIR architecture—it is simply a well-understood structure referenced for purposes of example. The following description will refer to specific spectral shapes for purposes of example, but many spectral shapes can be achieved using the techniques described in this document.

Figure 1A:
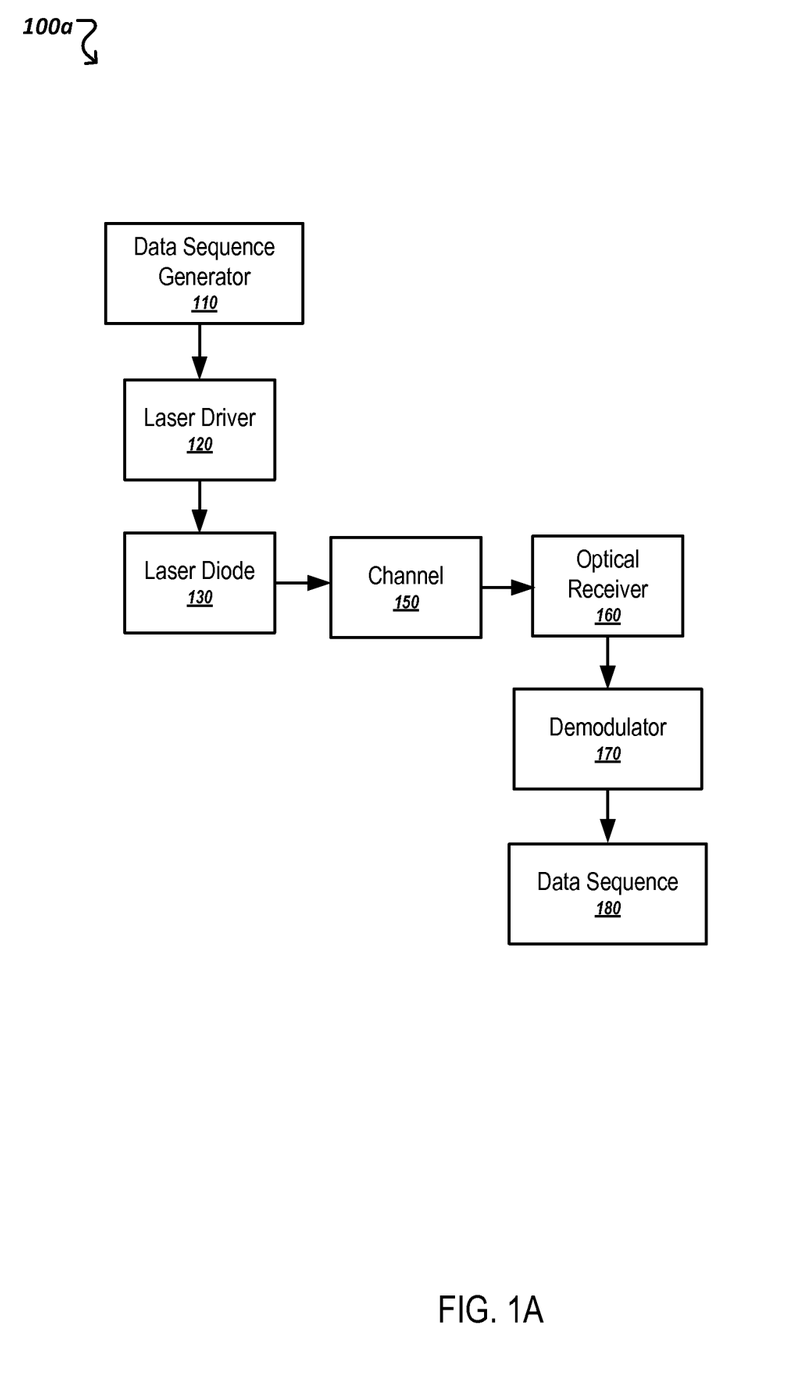
FIG. 1A is a block diagram of an example optical communication environment.

FIG. 1A is a block diagram of an example optical communication environment 100a. In the optical communication environment, a data sequence generator 110 generates data for transmission over a channel 150 (e.g., an optical channel). In a network environment, the data sequence generator 110 can be, for example, any device (e.g., a user device or network node) that is outputting an electrical data stream. In some implementations, the data sequences are binary data sequences.

The electrical data sequences are provided to a laser driver 120. Based on this sequence, the laser driver 120 modulates the light emitted from the laser diode into the optical channel 150. An optical receiver 160 receives the optical data sequence, and the optical signal is then demodulated at the demodulator 170 to create an estimate 180 of the original data sequence 110. In an ideal system, the data sequence estimate 180 matches the data sequence 110. However, errors may be experienced along the way. For example, there may be bandwidth limitations in the laser diode 130 or optical receiver 160 that introduce inter-symbol interference (ISI), and there will be noise in the system that can also induce errors. Such impairments degrade the quality of the optical signals and can cause errors in the communication. As such, the recovered data sequence 180 may differ from the data sequence output by the data sequence generator 110.

In some implementations, the differences between the recovered data sequence 180 and the data sequence output by the data sequence generator 110 can be reduced by pre-emphasizing the output of the laser driver to compensate for bandwidth limitations introduced, for example, by the laser diode 130 or the optical receiver 160. For example, as discussed with reference to FIG. 1B, pre-emphasis can be used to create an input to the laser diode 130 having a spectral shape that will offset losses experienced by the optical signals as they are transmitted through the environment.

Figure 1B:
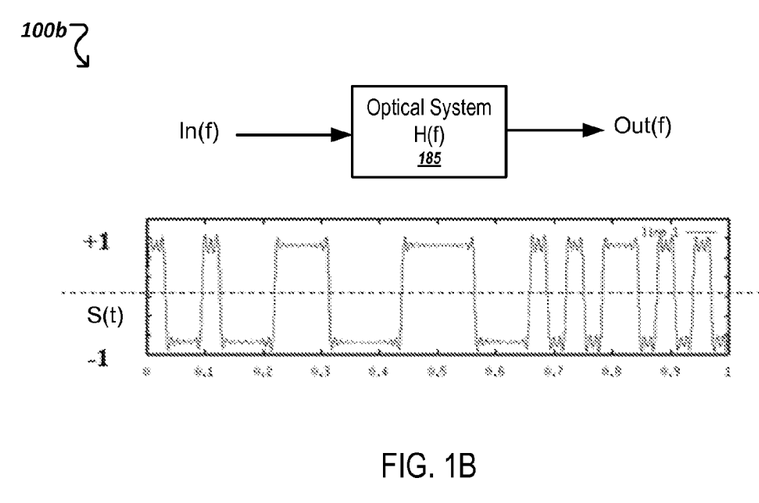
FIG. 1B is a block diagram illustrating example data communications through an optical system.

FIG. 1B is a block diagram illustrating example data communications through an optical system 185. The optical system 185 can include one or more of the laser diode 130, the channel 150, and/or the optical receiver 160 from FIG. 1A.

For purposes of example assume that the data stream S(t) is input to the optical system 185, which has a transfer function H(f). By definition, the H(f)=Out(f)/In(f). Thus, the transfer function H(f) characterizes how the input signal In(f) is modified as it propagates through the optical system 185. The transfer function H(f) characterizes how the magnitude and phase of signals vary across a spectral range. In a particular example, components of the signal S(t) having a frequency higher than X MHz may be attenuated (e.g., by −6 dB/decade) as they are transmitted through the optical system 185.

Figure 1C:
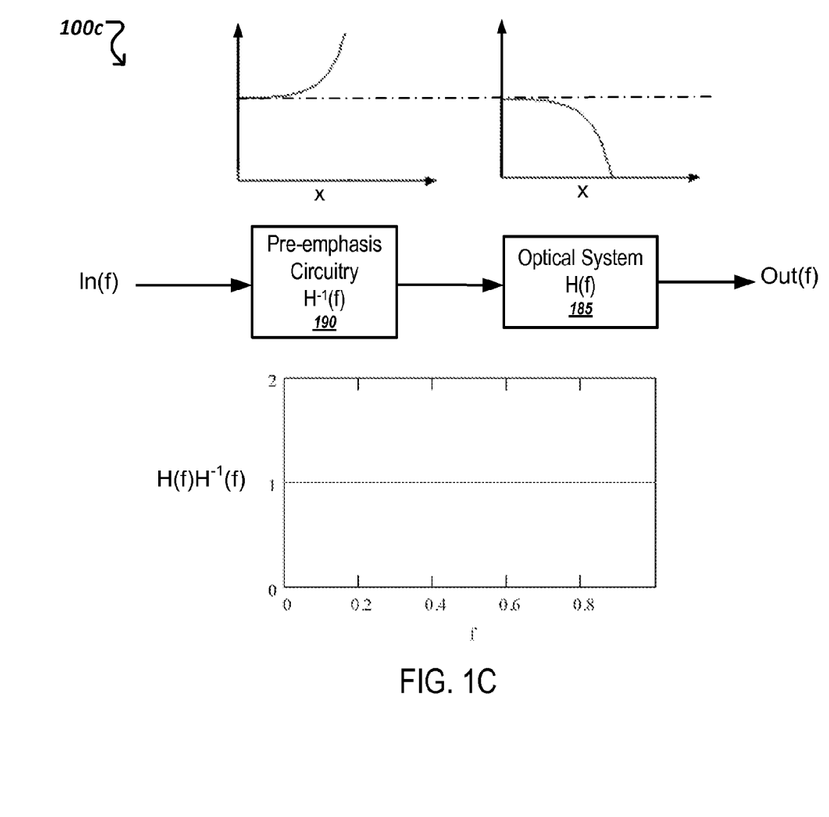
FIG. 1C is a block diagram illustrating how pre-emphasis can be used to flatten the spectral shape of signals.

In this example, adding pre-emphasis to the data stream S(t) prior to transmission over the optical system 185 may counter the effect of the losses, as shown in FIG. 1C. For example, assume that the data stream was modified in a way that resulted in spectral components of the data stream having a frequency higher than X MHz were increased relative to components of the data stream having a frequency lower than X MHz. In this example, the modification of the data stream results in pre-emphasis that increases the magnitude of particular spectral components of the data stream S(t) prior to transmission. When the modified data steam is transmitted through the optical system 185, the transfer function H(f) will reduce the magnitude of the components that exceed X MHz relative to the components that are less than X MHz. However, because the magnitude of the components that exceed X MHz were increased prior to transmission, the resulting output Out(f) will be more similar to the original signal S(t) than if the data stream S(t) had not been modified prior to transmission.

FIG. 1C is a block diagram 100c illustrating how pre-emphasis can be used to make Out(f)=In(f) 185. In some implementations, pre-emphasis circuitry 190 can be used to pre-emphasize the input In(f) before it is transmitted through the optical system 185. The pre-emphasis circuitry 190 has a spectral shape $H^{-1}(f)$ that is the inverse of the transfer function H(f) of the optical system 185, thereby providing a combined transfer function $H(OH^{-1}(f)$ that has a magnitude of 1.0 across the spectral range, as shown in FIG. 1C. For example, H(f) may be a low pass filter with a cutoff frequency of X. Meanwhile, the pre-emphasis circuitry 190 would be a high pass filter having a cutoff frequency of X. In this example, the combined transfer function H(f)H−1(f) will have a flat response up to and beyond the frequency X (e.g., a magnitude of 1.0 across a given frequency range), which results in an output Out(f) that matches the unmodified input In(f). For example, with reference to FIG. 1A the output data sequence 180 would match the input data sequence output from the data sequence generator 110. The pre-emphasis provides the ability to counter the effect of frequency-dependent losses over the optical system 185.

In some implementations, the input In(f) can be pre-emphasized using reflections that are purposely introduced using a mismatched transmission line. In some implementations, impedance mismatches are introduced to pre-emphasize the signals received at the laser diode. For example, the mismatched transmission line generates reflections that, when properly delayed, combine at the laser diode with the signals launched by the laser driver to create a pre-emphasized signal having a target (or desired) shape. In some implementations, the magnitudes and propagation delays of the reflections are selected to create a signal that has an inverse transfer function of the optical system over which the created signals will be transmitted.

As described in more detail below, the magnitude of the reflections will generally depend (at least in part) on the impedance mismatches selected, while the propagation delay will generally depend (at least in part) on the length of the transmission line between the laser diode and a reflective impedance element (e.g., a resistor, transmission line, or other impedance element that is connected to the transmission line). While the description that follows describes creating reflections that provide a desired spectral shape using impedance mismatches and transmission line delays, it will be appreciated that each of the magnitude of the reflections and the propagation delay may be adjusted in other ways to provide a desired spectral shape.

Figure 2:
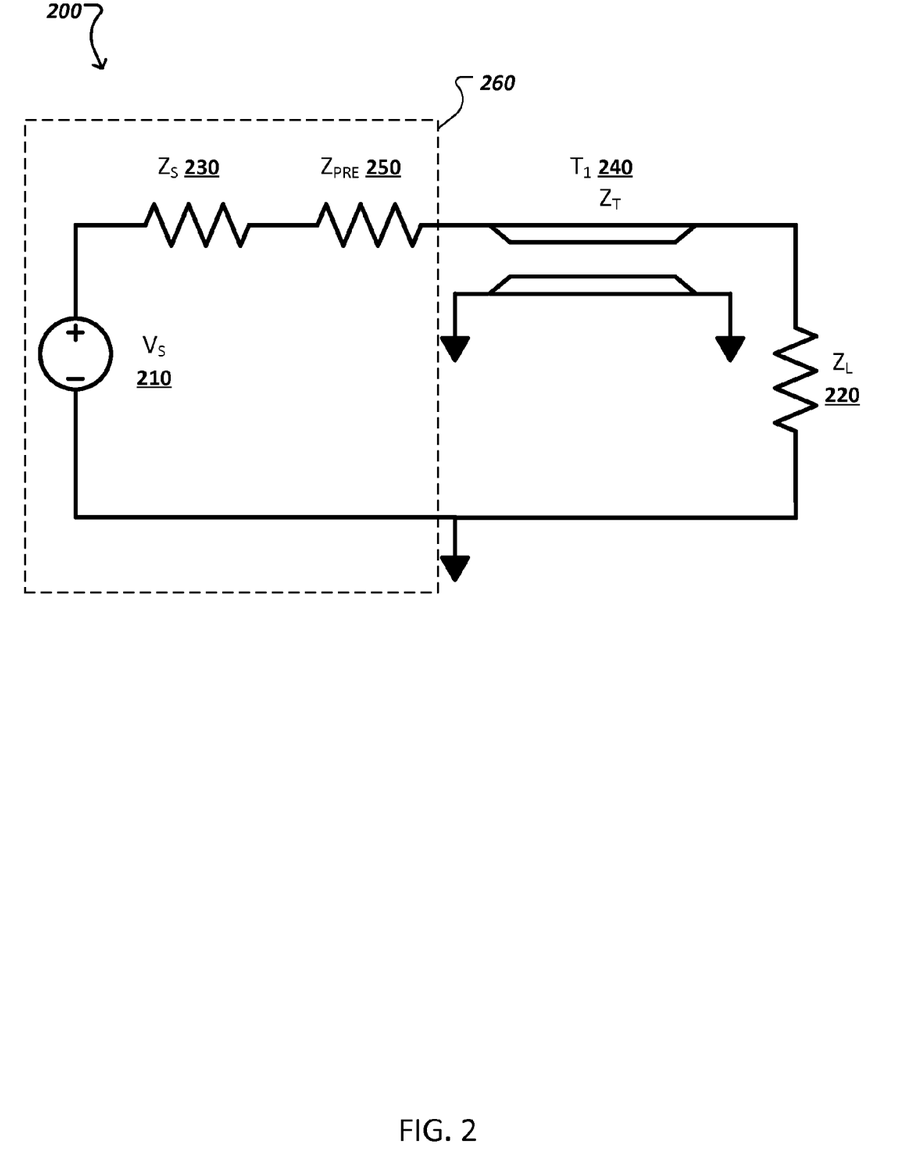
FIG. 2 is a schematic of an example circuit that uses reflection based pre-emphasis.

FIG. 2 is a schematic of an example circuit 200 that uses reflection based pre-emphasis to achieve a desired (i.e., target) spectral shape at a load. The circuit 200 includes a source ($V_s$) 210 that drives a load 220. In some implementations, the load 220 can be a laser diode or another optical output device and the source 210 can be the output of a laser driver or another device that provides an output (e.g., an electrical data stream) to the load 220. As illustrated, the source 210 has a source impedance 230 of $Z_S$, and the load 220 has a load impedance of $Z_L$. The source 210 can be connected to the load 220 by a transmission line ($T_1$) 240 which has a characteristic impedance $Z_T$. As will be discussed in more detail below, the transmission line 240 also has a corresponding propagation delay.

When $Z_{PRE}$ is 0, and the load impedance $Z_L$ and the source impedance $Z_S$ are matched to the characteristic impedance of the transmission line $Z_T$, the output of the source 210 will be passed to the load 220 without creating reflections that significantly affect the shape of the signal that is provided to the load 220. However, in order to create a signal having a target spectral shape that differs from the spectral shape of the signal output by the source 210, mismatches may be intentionally introduced at ends of the transmission line 240, thereby creating reflections that can change the spectral shape of the signal received by the load 220. There are many ways to create mismatches that result in reflections that provide a desired spectral shape of a signal at the load 220, some of which are described in detail below.

In some implementations, a mismatch can be created by selecting a load 220 that has a load impedance ($Z_L$) that differs from the characteristic impedance ($Z_T$) of the transmission line 240. As described in more detail with reference to FIG. 3, this mismatch will create a reflection at the load 220, which propagates back toward the source 210. As will be discussed in more detail below, the magnitude of the reflection created by the mismatch between the load impedance ($Z_L$) and the characteristic impedance ($Z_T$) will depend, at least in part, on the amount of mismatch (e.g., larger mismatches will generally result in larger reflections than smaller mismatches).

A mismatch can similarly be created by selecting a source 210 having a source impedance ($Z_S$) 230 that differs from the characteristic impedance ($Z_T$) of the transmission line 240. In this example, the mismatch between the source impedance ($Z_S$) 230 and the characteristic impedance ($Z_T$) will cause some of the signal reflected back toward the source by the mismatch between the load impedance ($Z_L$) and the characteristic impedance ($Z_T$) to be re-reflected back toward the load 220. Again, the magnitude of the signal reflected back toward the load 220 will depend, at least in part, on the level of mismatch between the source impedance 230 and the characteristic impedance ($Z_T$) of the transmission line 240.

As will be discussed in more detail below, the reflection magnitude and propagation delay of the reflected signal can be selected (e.g., through mismatch selections and appropriate propagation delay selection) so that the signal re-reflected back toward the load 220 will combine with the output of the source 210 at the load 220 in a manner that provides a signal having the desired spectral shape at the load 220.

In the previous example, each of the source impedance ($Z_S$) and the load impedance ($Z_L$) was selected to differ from the characteristic impedance ($Z_T$) of the transmission line 240. Therefore, no additional impedance elements were required to create the impedance mismatches, such that the impedance element 250 was not required. In some implementations, the mismatch with the characteristic impedance $Z_T$ is created by connecting an impedance element 250 to the source end of the transmission line 240. In these implementations, the combination of the impedance element 250 and the source impedance 230 provide the mismatch with the characteristic impedance ($Z_T$).

For example, assume that the impedance element $Z_{PRE}$ 250 is connected in series between the source impedance 230 and the source end of the transmission line 240, as shown in FIG. 2. In this example, the impedance element 250 can be selected so that the sum of the source impedance 230 and the impedance ($Z_{PRE}$) of the impedance element 250 provides the level of mismatch that will provide a large enough reflection to create the signal having the desired (e.g., target) spectral shape at the load 220. If $Z_S$ and $Z_T$ are equal, then $Z_{PRE}$ will equal the mismatch. The impedance element 250 can be, for example, a resistor, a transmission line, or any combination of one or more resistors, transmission lines, capacitors, inductors, and/or other circuit elements.

As used throughout this document, the phrase reflective impedance element is used to refer to one or more impedance elements that provide the impedance mismatch at the source end of the transmission line 240. For example, the reflective impedance element could simply be the source impedance 230 in situations where the source is selected to have a source impedance that differs from the characteristic impedance. As discussed above, the reflective impedance element could also be a series (and/or parallel) combination of multiple impedance elements. For example, as shown in FIG. 2, the components within the dashed box 260 can be referred to as a reflective impedance element.

It will be appreciated that when the reflective impedance element includes multiple different impedance elements, the combined (i.e., equivalent) or given impedance value of the reflective impedance element will differ from the characteristic impedance ($Z_T$) even though any of the individual impedance elements included in the reflective impedance element may have the same impedance as the characteristic impedance ($Z_T$). For example, in FIG. 2, the source impedance 230 and the impedance element 250 could each have the same impedance as the characteristic impedance ($Z_T$), but the combined impedance of the reflective impedance element that includes the source impedance 230 and the impedance element 250 will be $2*Z_T$ (i.e., $Z_S+Z_{PRE}$).

Figure 3:
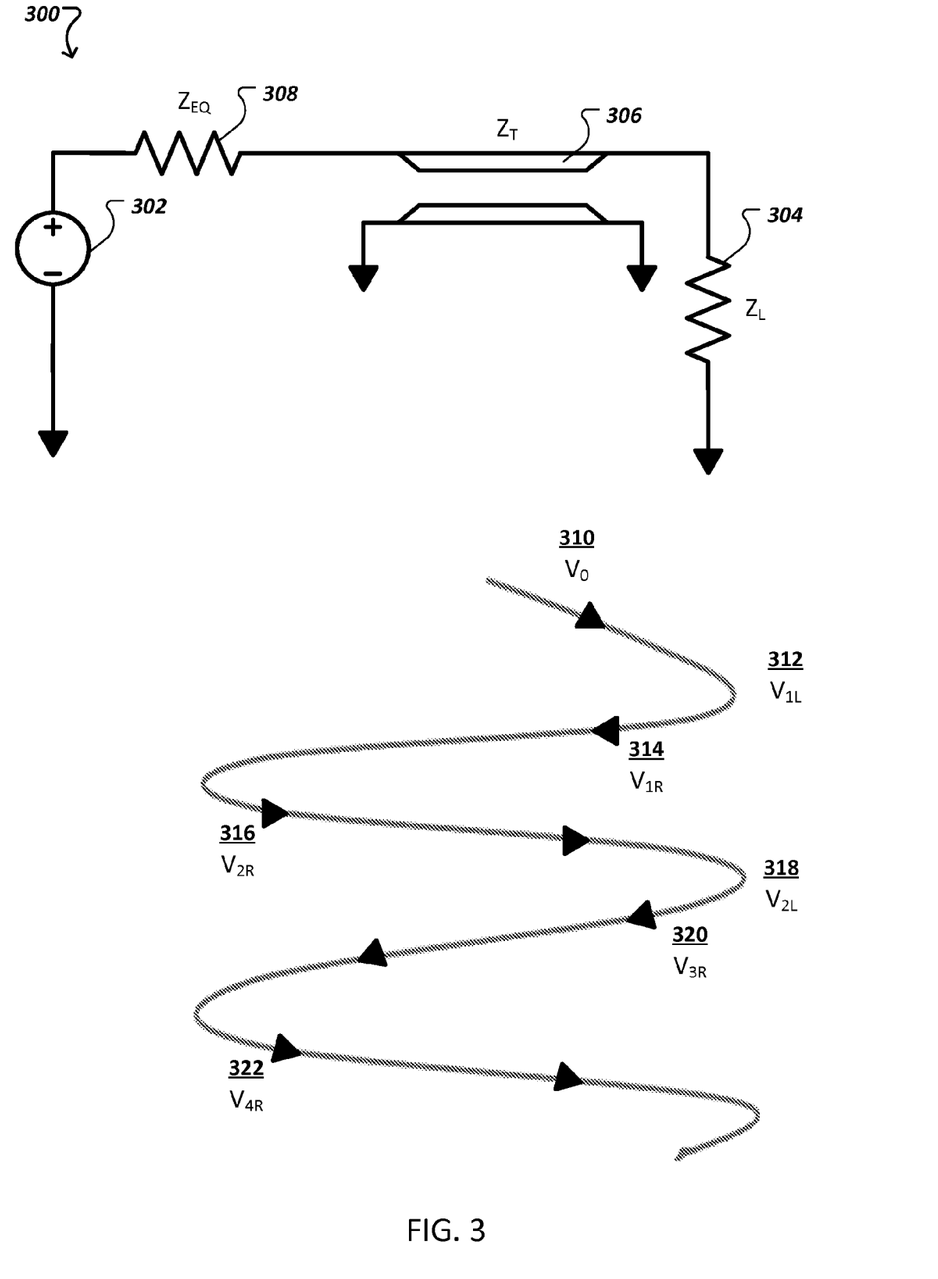
FIG. 3 is an illustration of mismatch induced reflections propagating through an example circuit.

FIG. 3 is an illustration of mismatch induced reflections propagating through an example circuit 300. The example circuit 300 FIG. 3 is similar to the example circuit 200. For example, the circuit 300 includes a source 302, a load 304 having a load impedance ($Z_L$), and a transmission line 206 having a characteristic impedance ($Z_T$). However, in the circuit 300, the reflective impedance element 308 is being used to represent the combination of the various different impedance elements (e.g., the source impedance and/or at least one other impedance element) that are used to achieve the equivalent impedance ($Z_{EQ}$), which differs from the characteristic impedance ($Z_T$) to create reflections back toward the load 304.

As illustrated by FIG. 3, the source 302 outputs a signal that propagates through the reflective impedance element 308 and across the transmission line 306. Just prior to its emergence from the transmission line, this signal is referred to as a load incident signal. The load incident signal 310 has a magnitude of $V_o$.

If there is a mismatch between the load impedance ($Z_L$) and the characteristic impedance ($Z_T$), some of the load incident signal 310 will pass through (i.e. be absorbed by) the load 304, and the residual energy will be reflected back toward the source 302. For example, as shown in FIG. 3, the signal 312, having a magnitude of $V_{1L}$, will pass through the load 304, while the signal 314, having a magnitude of $V_{1R}$, will be reflected back toward the source 302.

When the signal 314 reaches the reflective impedance 308, the signal 316, which is a portion of the signal 314 and has a magnitude $V_{2R}$, will be reflected back toward the load 304 due to the mismatch between the equivalent impedance ($Z_{EQ}$) and the characteristic impedance ($Z_T$). When the signal 316 reaches the load 304 it will combine with the signal 312 V1L to create an adjusted output signal 318 V2L. A portion of the arriving signal 316 will be reflected back toward the source. For example, the signal 320, which is the portion of the signal 316 that is reflected back toward the source 302, can have a magnitude of $V_{3R}$. The magnitude of the adjusted output signal 318 can be $V_{2L}$, which can be a sum of the magnitude $V_{1L}$ of the portion of the load incident signal 310 that passes through the load and the magnitude of the portion of the signal 316 that passes through the load (i.e., $V_{2R}+V_{3R}$). As such, the magnitude of the signal 318 can be equal to $V_{1L}+V_{2R}+V_{3R}$.

While the signal 320 is reflected back toward the source, in most situations, the magnitude $V_{3R}$ of the signal 320 and/or the magnitude $V_{4R}$ of the signal 322, which is subsequently reflected back toward the load by the reflective impedance element 308, will generally be small enough such that the effect of these subsequent reflections will not materially change the load signal. Therefore, for purposes of the present discussion, the effects of those subsequent reflections will not be considered.

Figure 4:
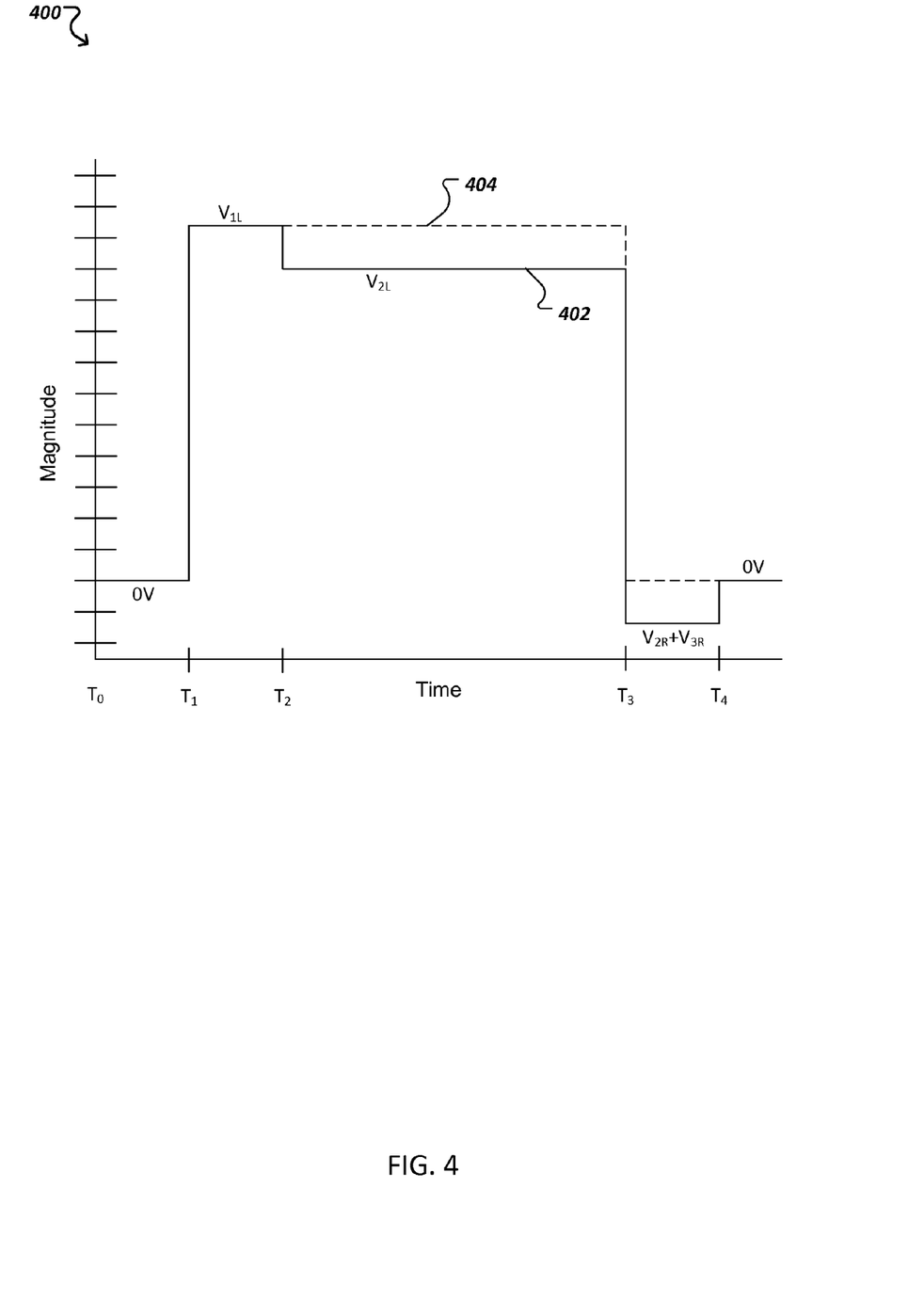
FIG. 4 is a graph illustrating an example a target signal created based on the combinations of a load incident signal and reflections.

FIG. 4 is a graph 400 illustrating an example a target signal 402 created based on the combinations of an initial load signal V1L and subsequent reflections, as described above with reference to FIG. 3. As illustrated in FIG. 4, an un-emphasized signal 404 differs from the target signal 402 as illustrated by the dashed lines 404. In a particular example, the un-emphasized signal can be a digital data stream encoded as a Non-Return-to-Zero (NRZ) waveform. The target signal 402 is a modified signal having a first portion (e.g., between time $T_1$ and time $T_2$) that has a higher magnitude than a second portion (e.g., between time $T_2$ and $T_3$).

The target signal 402 has a magnitude of 0V from time $T_0$ to time $T_1$. At time $T_1$, the magnitude of the target signal 402 rises to $V_{1L}$, which corresponds to the time at which the digital logic level switches from a 0 to a 1. As discussed above with reference to FIG. 3, the magnitude of $V_{1L}$ is the magnitude of the portion of the load incident signal 310 that is passed through the load 304, as discussed above with reference to FIG. 3.

At time $T_2$, the magnitude of the target signal 402 drops to $V_{2L}$, combining respective portions of the load incident signal 310 and the reflected signal 316 that are passed through the load to achieve the adjusted output signal 318. For example, if the reflected signal 316 has an opposite polarity relative to the load incident signal 310, the superposition of 310 and 316 will reduce the voltage at the load.

At time $T_3$, the target signal 402 transitions from a high digital logic value (e.g., 1) to a low digital logic value (e.g., 0). Given the voltage just before the transition at $T_3$, the magnitude of the signal 402 will initially fall to approximately $V_{2R}+V_{3R}$. This creates another round of reflections that follow the same pattern as previously discussed, though the input signal carries the opposite sign.

In some implementations, the duration of the time period from $T_1$ to $T_2$ (and also from $T_3$ to $T_4$) will be based, at least in part, on a propagation delay of the reflections between the load 304 and the reflective impedance element 308. For example, the round trip delay for reflections will be twice the transmission line propagation time, and will define the duration between $T_1$ and $T_2$. Increases in the propagation delay of the reflections will provide larger durations between $T_1$ and $T_2$ (and also between $T_3$ and $T_4$), while shorter propagation delays between the load and the reflective impedance element will provide shorter durations between $T_1$ and $T_2$ (and also between $T_3$ and $T_4$). As such, the propagation time of the transmission line 306 is a key design parameter.

In a particular example, the length of the transmission line can be selected to provide a one-way propagation delay of ½ a baud time so that reflections will make a round trip and arrive back at the load at the beginning of the next symbol. As used throughout this document, a baud time is an amount of time required to transmit one symbol in the communication system.

For example, in many cases the load (e.g., a laser diode) will have parasitic components that result in a frequency response that resembles a low pass filter having a given cutoff frequency. The filter effects of these parasitic components are generally undesired because they will filter (i.e., reduce the amplitude of) signal components that exceed the cutoff frequency, thereby limiting the frequency band over which the load is operable. In these cases, if the signal driving the load has a spectral shape that resembles a high pass filter having the given cutoff frequency, the composite response will be flatter, thereby offsetting the undesired effects of the parasitic components of the load. The signal components that exceed the cutoff frequency will still be attenuated due to the filter effects of the parasitic load components, but because the magnitude of those signal components are higher than lower frequency signal components, the magnitude reduction of those higher frequency signal components (e.g., components that exceed the cutoff frequency) will result in a more even signal component magnitude among the higher and lower frequency components, thereby providing a flatter load frequency response. Thus, the target spectral shape of an output signal can be selected to offset the undesired filter effects of the parasitic components of the load.

The following paragraphs provide various relationships that can be used to model characteristics of signal pre-emphasis circuits similar to those discussed above. First, the amount of pre-emphasis that is provided by a circuit, such as the circuit 300 can be estimated using relationship (1).

$$\text{PreEmphasis} = 20\log\frac{V_{1L} - (V_{2R} + V_{3R})}{V_{2L}} \tag{1}$$

where,

PreEmphasis is the amount of pre-emphasis (in dB) applied to the source output;

$V_{1L}$ is a portion of the first incident signal that passes through the load;

$V_{2R}$ is a portion of the $V_{1R}$ (discussed above) that is reflected back toward the load due to the impedance mismatch between the characteristic impedance of the transmission line and $Z_{eq}$ the reflective impedance element;

$V_{3R}$ is a portion of $V_{2R}$ that is reflected back toward the source due to the impedance mismatch between the characteristic impedance of the transmission line and the load impedance; and $$V_{2L} = V_{1L} + (V_{2R} + V_{3R}).$$

More generally, relationship (1) can be expressed in terms of source and load reflection coefficients, as shown in relationship (2).

$$\text{PreEmphasis} = 20 * \log\frac{1 - \Gamma_L * \Gamma_S}{1 + \Gamma_L * \Gamma_S} \tag{2}$$

where,

PreEmphasis is the amount of pre-emphasis (in dB) applied to the source output;

$\Gamma_L$ is the reflection coefficient at the load; and $\Gamma_S$ is the reflection coefficient at the source.

In situations where the source impedance and the load impedance are fixed, the impedance element $Z_{PRE}$ 250 of FIG. 2 can be used to create the mismatch that provides the desired reflections. In these situations, the impedance of $Z_{PRE}$ 250 of FIG. 2 can be selected using relationship (3).

$$Z_{PRE} = \frac{10^{\frac{\text{PreEmphasis}}{20}} \cdot \left(Z_T + Z_S \cdot \frac{Z_L}{Z_T}\right) - Z_S - Z_L}{1 - 10^{\frac{\text{PreEmphasis}}{20}} \cdot \frac{Z_L}{Z_T}} \tag{3}$$

where, $Z_{PRE}$ is the impedance of the impedance element $Z_{PRE}$ 250 of FIG. 2;

PreEmphasis is the amount of pre-emphasis (in dB) applied to the load;

$Z_T$ is the characteristic impedance of the transmission line 306 between the impedance element $Z_{PRE}$ 250 and the load;

$Z_S$ is the source impedance; and $Z_L$ is the load impedance.

With reference again to FIG. 3, the following example values can be used to create a target signal having a spectral shape similar to that of a high pass filter. For purposes of this example, assume that $Z_{EQ}$, which is $Z_{PRE} + Z_S$, has a value of 35 ohms, $Z_T$ has a value of 25 ohms, and $Z_L$ has a value of 4 ohms. Also assume that the open-circuit signal launched from the source 302 is 1V. Further assume that the length of the transmission line is selected to provide a round trip propagation delay of 1 baud time (i.e., ½ baud time in each direction).

In this example, the following relationships can be used to model the characteristics of the circuit.

$$V_0 = \frac{Z_T}{Z_{EQ} + Z_T} \tag{4}$$

where, $V_0$ is the signal that enters the transmission line 306;

$Z_{EQ}$ is $Z_S + Z_{PRE}$; and $Z_T$ is the transmission line impedance.

$$\Gamma_L = \frac{Z_L - Z_T}{Z_L + Z_T} \tag{5}$$

where, $\Gamma_L$ is the reflection coefficient at the load;

$Z_L$ is the load impedance; and $Z_T$ is the transmission line impedance.

$$\Gamma_S = \frac{Z_{EQ} - Z_T}{Z_{EQ} + Z_T} \quad (6)$$

where, $\Gamma_S$ is the reflection coefficient at the source;

$Z_{EQ}$ is the impedance of the reflective impedance element 308 consisting of $Z_S + Z_{PRE}$; and $Z_T$ is the transmission line impedance.

In this example, the reflection coefficient at the source $\Gamma_S$ will be 0.167V, the reflection coefficient at the load $\Gamma_L$ will be −0.724V, and the transmission line output to the load $T_L$ will be 0.276V. Table 1 provides example voltages from the reflection diagram of FIG. 4 for this example.

TABLE 1

| Voltage | Formula | Value (V) |
|---|---|---|
| $V_0$ | $\dfrac{Z_T}{Z_{EQ} + Z_T}$ | 0.417 |
| $V_{1R}$ | $V_0 * \Gamma_L$ | −0.302 |
| $V_{1L}$ | $V_0 + V_{1R}$ | 0.115 |
| $V_{2R}$ | $V_{1R} * \Gamma_S$ | −0.05 |
| $V_{3R}$ | $V_{2R} * \Gamma_L$ | 0.036 |
| $V_{2L}$ | $V_{1L} + V_{2R} + V_{3R}$ | .101 |
| $V_{4R}$ | $V_{3r} * \Gamma_S$ | $6.069 \times 10^{-3}$ |

The resulting target signal provided to the load is similar to that depicted by FIG. 4. As discussed above, the reflections may be used to pre-emphasize particular frequencies of a signal in order to counter the effects of losses that the signal will incur over a transmission channel. Reflections may also be used to further filter the signal for purposes other than countering the effects of losses over the channel. For example, various combinations of reflections and transmission delays can be used to create signals having various different spectral shapes, as desired.

Figure 5:
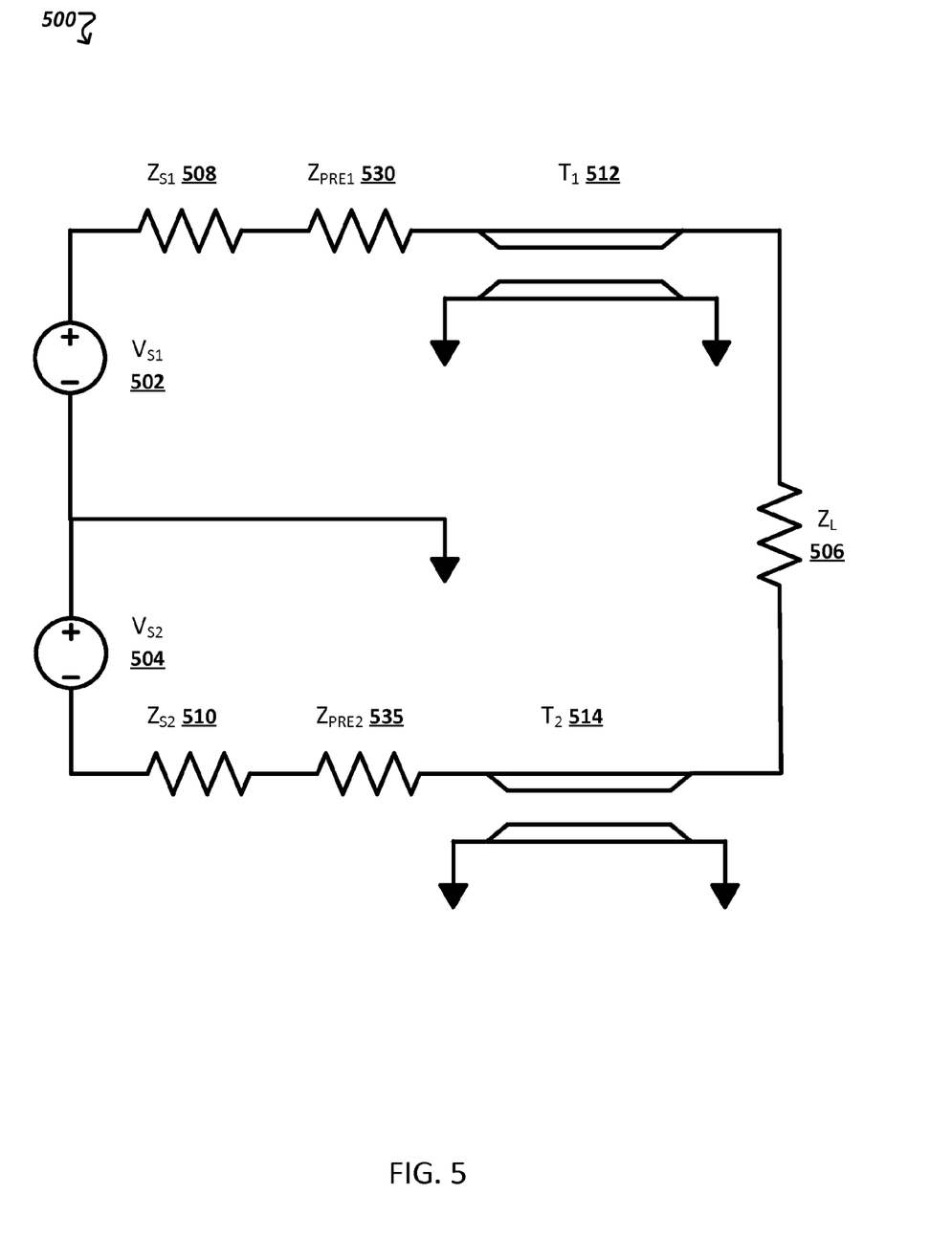
FIG. 5 is a schematic of an example differential circuit that uses reflection based pre-emphasis to achieve a desired (i.e., target) spectral shape at the load.

The description above has referred to single ended circuits. The concepts described above can also be applied in differential circuits. For example, FIG. 5 is a schematic of an example differential circuit 500 that uses reflection based pre-emphasis to achieve a desired (i.e., target) spectral shape at the load. The differential circuit 500 includes a differential source represented by $V_{S1}$ 502 and $V_{S2}$ 504 that drives a load 506. In some implementations, the load 506 can be a laser diode or another optical communications device. The differential source can be, for example, a differential output of a laser driver or another device that provides a differential output (e.g., a differential electrical data stream) to the load 506. As illustrated, each output (e.g., 502 and 504) of the differential source can have a respective source impedance. For example, the positive output 502 has a source impedance of $Z_{S1}$ 508, while the negative output 504 has a source impedance of $Z_{S2}$ 510. Each output of the differential source is connected to the load 506 by a respective transmission line. For example, the positive output 502 is connected to the load 506 through transmission line $T_1$ 512, while the negative output 504 is connected to the load 506 through transmission line $T_2$ 514. Each of the paths from the differential source to the load 506 includes another impedance element that can be used to create reflections that will provide an output signal with the desired (i.e., target) spectral shape. For example, each of the impedance elements $Z_{PRE1}$ 516 and $Z_{PRE2}$ 518 can be selected to provide a load signal similar to that discussed above with reference to FIGS. 3 and 4. In particular, the differential load signal provided by the differential circuit 500 can be similar to the signal 400 so that the output of the load 506 will be spectrally flattened relative to unemphasized case.

Figure 6:
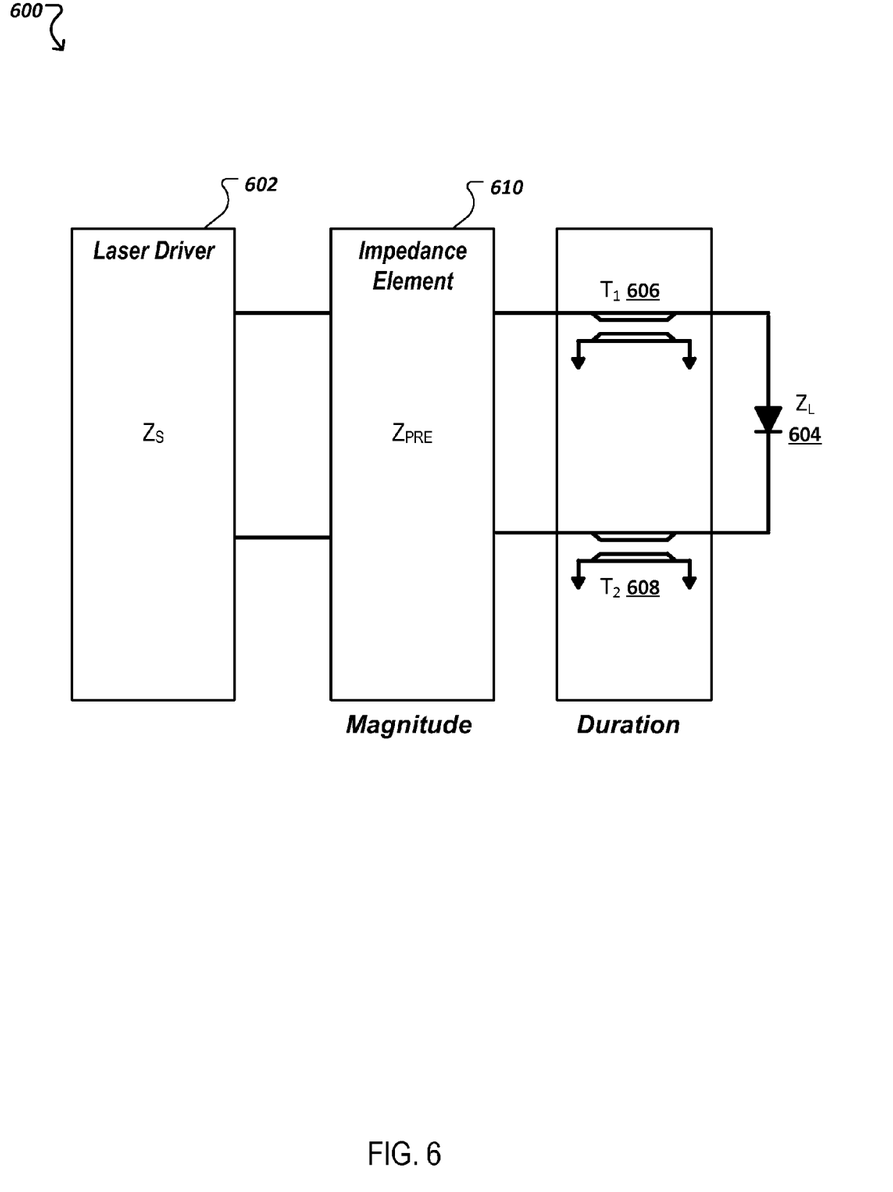
FIG. 6 is a block diagram an example differential circuit that uses reflection based pre-emphasis to achieve a desired (i.e., target) spectral shape at the load.

FIG. 6 is a block diagram of an example differential circuit 600 that uses reflection based pre-emphasis to achieve a desired (i.e., target) spectral shape at the load. The differential circuit 600 can be used, for example, in an optical communications system. For example, the differential circuit 600 can be included in a communications node that transmits and/or receives optical communication signals that are created based on an electric data stream output by an electrical device.

The differential circuit 600 includes a laser driver 602, which has a source impedance of $Z_S$. The differential circuit 600 drives a laser diode 604, which has a load impedance of $Z_L$ and a frequency response that resembles a low pass filter with a given cutoff frequency. In some implementations, the laser driver 602 is connected to the laser diode 604 through the transmission lines $T_1$ 606 and $T_2$ 608.

The differential circuit 600 also includes a reflective impedance element 610. In some implementations, the reflective impedance element 610 is connected to the laser driver 602 by a transmission line (not shown). As discussed above, the reflective impedance element 610 is selected to create an impedance mismatch relative to the characteristic impedance of the transmission lines 606 and 608. As discussed above, the impedance mismatch will create reflections, which can combine with a portion of a load incident signal output from the laser driver 602 to create a signal having a target spectral shape. For example, as shown above with reference to FIG. 4, the reflections can attenuate a portion of the load incident signal, which results in a combined load signal having rising and falling edge overshoot. The magnitude of the overshoot is controlled by the level of mismatch between the characteristic impedance of the transmission lines 606 and 608 and the reflective impedance element 610. For example, increasing the mismatch will create larger reflections, which will provide a larger amount of attenuation (assuming that the reflections have negative polarity relative to the load incident signal output by the laser driver). The larger amount of attenuation will result in a signal having a larger overshoot, thereby further emphasizing higher frequency signals relative to lower frequency signals. As noted above, the reflective impedance element 610 can be any impedance element or combination of impedance elements. For example, the reflective impedance element can be a resistor or another discrete impedance elements or the reflective impedance element can be one or more transmission lines.

The length of the transmission lines 606 and 608 control the duration of the overshoot that is created by the combination of the reflections and the output of the laser driver 602. For example, increasing the length of the transmission line will increase the round trip propagation delay of the reflections, thereby further delaying the combination of the reflections with a portion of the load incident signal provided by the source. The result is a longer overshoot duration. In contrast, shortening the length of the transmission line will decrease the round trip propagation delay of the reflections, which will result in a shorter overshoot duration. As should be appreciated, a combination of overshoot and overshoot duration can be selected so as to create a pre-emphasized signal that emphasizes various frequency components that may be negatively affected by parasitic components of the channel over which the signal is transmitted.

For example, the operating range of the laser diode 604 can be extended beyond its rated operating range (e.g., beyond the given cutoff frequency) by pre-emphasizing the load signal so as to increase the magnitude of frequency components beyond the cutoff frequency of the laser diode 604. In this example, the pre-emphasis of the load signal will provide a load output that has a flatter frequency response (e.g., over a wider frequency range) than would be achieved absent the pre-emphasis. Therefore, higher data rates can be achieved without requiring a higher rated laser diode (e.g., a laser diode with a wider operating range).

Figure 7:
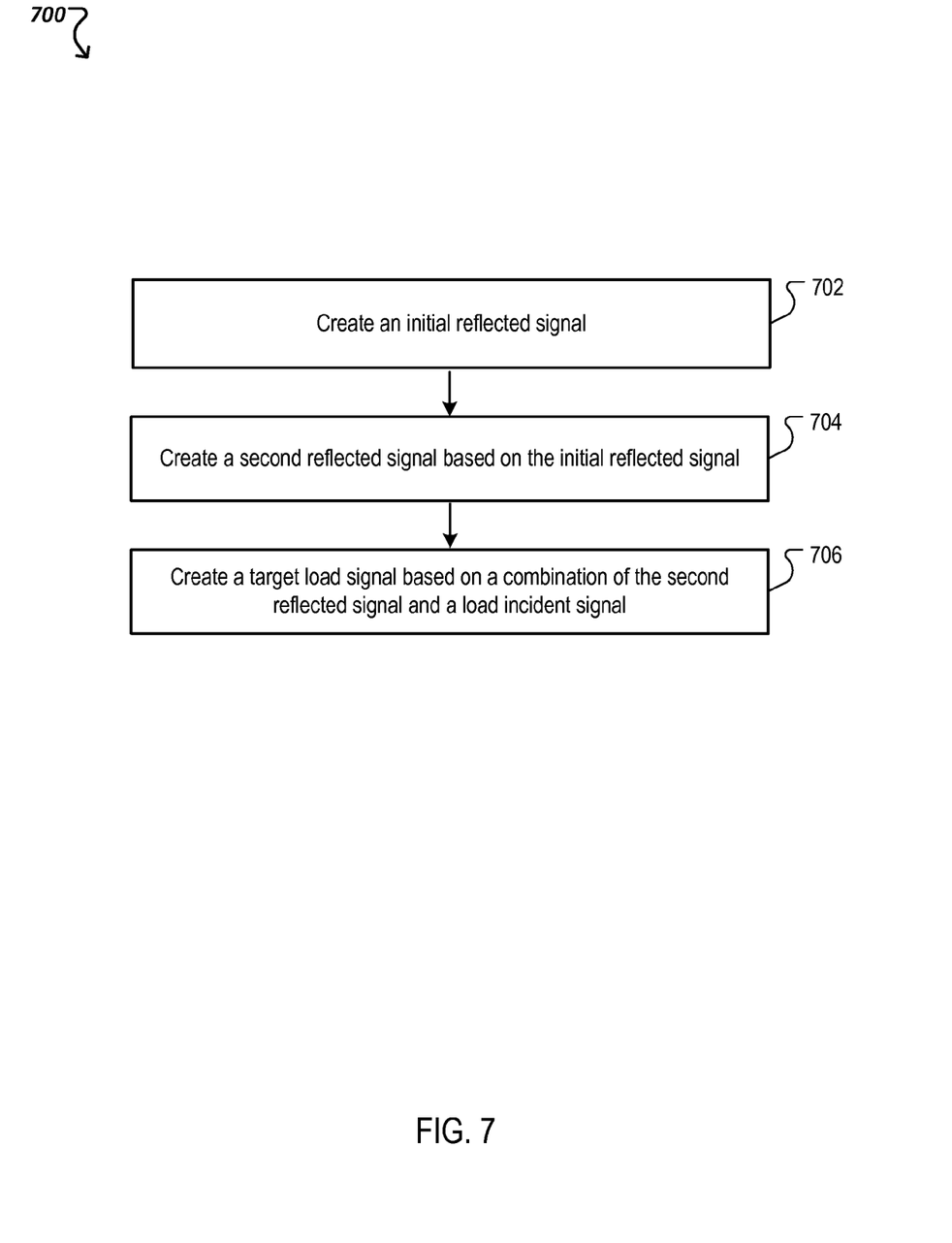
FIG. 7 is a flow chart of an example process for creating a target load signal having a target spectral shape.

FIG. 7 is a flow chart of an example process 700 for creating a target load signal having a target spectral shape. In some implementations, the process 700 can be performed using a pre-emphasis circuit similar to those discussed above with reference to FIGS. 1-6. In some implementations, other circuits and/or components can be used to perform operations of the process 700.

An initial reflected signal is created (702). In some implementations, the initial reflected signal is created due to an impedance mismatch between a load impedance of a load and a characteristic impedance of a transmission line connected to the load. For example, as discussed above, a signal that is transmitted over the transmission line and presented to the load, will be partially passed through the load and partially reflected back into the transmission line. The magnitude, amount, or portion of the signal that is reflected back through the transmission line will depend on the level of mismatch between the load impedance and the characteristic impedance. For example, as the mismatch increases, the amount of the signal that is reflected will similarly increase.

The polarity of the reflected signal depends on the relative impedance values of the circuit components. For example, if the load impedance is less than the characteristic impedance of the transmission line, the reflection coefficient at the load will be negative, thereby creating a reflection of opposite polarity relative to the signal received at the load. However, if the load impedance is greater than the characteristic impedance of the transmission line, the reflection coefficient at the load will be positive, thereby creating a reflection having the same polarity as the signal received at the load.

A second reflected signal is created based on the initial reflected signal (704). In some implementations, the second reflected signal is created based on a mismatch between a reflective impedance element and the characteristic impedance of the transmission line. For example, as discussed above, the amount of the initial reflected signal that is reflected back over the transmission line toward the load will be proportional to the impedance mismatch. The polarity of the second reflected signal (i.e., the portion of the initial reflected signal that is reflected back toward the load) will depend on the magnitude of the characteristic impedance and the magnitude of an equivalent impedance of the reflective impedance element.

The polarity of the second reflected signal will depend on the magnitudes of the equivalent impedance and the characteristic impedance of the transmission line. For example, when the equivalent impedance is greater than the characteristic impedance, the polarity of the second reflected signal will be the same as the polarity of the initial reflected signal. When the characteristic impedance is greater than the equivalent impedance, the second reflected signal will have an opposite polarity relative to the initial reflected signal.

A target load signal is created (706). In some implementations, the target load signal has a target spectral shape, and is created based on a combination of the second reflected signal and a portion of the load incident signal. For example, as discussed above with reference to FIGS. 3 and 4, the second reflected signal will combine with a portion of the load incident signal that is passed to the load to create an adjusted load signal having a desired spectral shape. The spectral shape of the target load signal will be different than the load incident signal. For example, the target load signal can have a target spectral shape that is similar to the frequency response of a high pass filter. In some implementations, the target spectral shape will flatten a frequency response of some portion of the system. For example, if the load has a frequency response of a low pass filter, passing the target load signal through the load will provide a load output signal that has a flatter frequency response than that provided when an unadjusted signal is passed through the load. As such, the spectral shape of the target load signal can offset the undesired effects of parasitic elements in the load.

In some implementations, delivery of the second reflected signal to the load is delayed by ½ a baud time of the load incident signal. For example, the length of the transmission line between the reflective impedance element and the load can be selected to provide a propagation delay of ½ the baud time. Alternatively, other delay elements can be used to create the desired delay.

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

What is claimed is:

1. A device comprising:
   a load having a load impedance, wherein an output of the load has a frequency response of a low pass filter having a cutoff frequency at a first frequency;
   a first end of a transmission line connected to the load, wherein the transmission line has a characteristic impedance that differs from the load impedance; and a reflective impedance element connected to a second end of the transmission line, wherein:
the reflective impedance element has a given impedance value that differs from the characteristic impedance;
mismatches between the characteristic impedance and each of the given impedance value and the load impedance value causes reflections between the reflective impedance element and the load; and
the reflections between the reflective impedance element and the load combine with an incident signal at the load to create a pre-emphasized signal having a target spectral shape that is provided to the load, and wherein higher frequency components of the pre-emphasized signal have a higher magnitude than lower frequency components of the pre-emphasized signal, and the cutoff frequency of the output of the load is shifted, by the pre-emphasized signal, to a second frequency that is higher than the first frequency.

2. The device of claim 1, wherein:
the transmission line is selected to provide a target amount of propagation delay; and
the reflective impedance element is connected between a source of the incident signal and the second end of the transmission line.

3. The device of claim 2, wherein the specified amount of propagation delay is selected to achieve the pre-emphasized signal having the target spectral shape.

4. The device of claim 1, wherein the transmission line provides a propagation delay corresponding to ½ a baud time in each direction.

5. The device of claim 1, wherein the target spectral shape flattens a frequency response of at least some portion of the device.

6. The device of claim 1, wherein the target spectral shape is selected to offset parasitics in the device, wherein the parasitics create bandwidth limitations in the device, and the target spectral shape offsets undesired filtering effects resulting from the parasitics.

7. The device of claim 1, wherein the reflective impedance element is a discrete resistor, inductor, or capacitor connected to a source by a first transmission line and connected to the load by a second transmission line.

8. The device of claim 1, wherein:
the load is a laser; and
parasitics in the load create a low pass filter response.

9. The device of claim 1, wherein the reflective impedance element comprises:
a second transmission line having a second transmission line impedance that differs from the characteristic impedance.

10. A method, comprising:
creating an initial reflected signal based on a load incident signal and an impedance mismatch between a load impedance of a load and a characteristic impedance of a transmission line connected to the load, wherein an output of the load has a frequency response of a low pass filter having a cutoff frequency at a first frequency;
creating a second reflected signal based on the initial reflected signal and an impedance mismatch between a reflective impedance element and the characteristic impedance; and
creating a target load signal having a target shape based on a combination of the second reflected signal and the load incident signal, wherein contributions of the second reflected signal to the target load signal result in higher frequency components of the target load signal having a higher magnitude than lower frequency components of the target load signal, and wherein the target load signal shifts the cutoff frequency of the output of the load to a second frequency that is higher than the first frequency.

11. The method of claim 10, wherein creating a second reflected signal comprises creating a second reflected signal that has an opposite polarity relative to the load incident signal.

12. The method of claim 10, further comprising delaying arrival of the second reflected signal at the load for ½ a baud time from creation of the second reflected signal.

13. The method of claim 10, wherein creating a target load signal having a target shape comprises creating a target load signal having a spectral shape of a high pass filter.

14. The method of claim 10, wherein creating a target load signal having a target spectral shape comprises creating a target load signal having a target spectral shape that flattens a frequency response of at least a portion of a communications system.

15. The method of claim 10, wherein creating a target load signal having a target spectral shape comprises creating a target load signal having a target spectral shape that offsets undesired effects of parasitic elements of a device.

16. A system, comprising:
a transmission channel; and
a communications node that communicates over the transmission channel, the communications node comprising:
a load that outputs a communications signal over the transmission channel, the load having a load impedance, wherein an output of the load has a frequency response of a low pass filter having a cutoff frequency at a first frequency;
a reflective impedance element connected to the load through a transmission line, wherein an impedance mismatch between the reflective impedance element and the transmission line create reflections that combine with a portion of a load incident signal to create a target load signal having a target spectral shape that differs from the load incident signal, wherein higher frequency components of the target load signal have a higher magnitude than lower frequency components of the target load signal, and the cutoff frequency of the output of the load is shifted, by the target load signal, to a second frequency that is higher than the first frequency.

17. The system of claim 16, wherein a length of the transmission line is selected to provide a target amount of propagation delay.

18. The system of claim 16, wherein a length of the transmission line provides a propagation delay of ½ a baud time of the load incident signal.

19. The system of claim 16, wherein the target spectral shape flattens a frequency response of a portion of the system.

20. The system of claim 16, wherein the reflective impedance element is one of a discrete circuit component connected between a source and the transmission line, a different transmission line that connects the source to the transmission line, a combination of the source and a resistor connected between the source and the transmission line, a combination of the source and the different transmission line that connects the source to the transmission line, or the source having a source impedance that differs from the characteristic impedance of the transmission line.

\* \* \* \* \*